United States Patent [19]

Goto et al.

[11] Patent Number: 4,862,056
[45] Date of Patent: Aug. 29, 1989

[54] INTERFACE FOR AN ELECTRICAL DEVICE

[75] Inventors: Kouji Goto, Toyota; Syuji Noda, Toyoake, both of Japan

[73] Assignee: Aisin Seiki Kaboshiki Kaisha, Japan

[21] Appl. No.: 194,534

[22] Filed: May 16, 1988

[30] Foreign Application Priority Data

May 15, 1987 [JP] Japan ................... 62-119294

[51] Int. Cl.[4] ........................... B05F 1/56
[52] U.S. Cl. ..................... 323/275; 323/271; 323/284
[58] Field of Search ............ 323/267, 271, 274, 275, 323/280, 281, 285, 288, 289

[56] References Cited

U.S. PATENT DOCUMENTS 4,684,876 8/1987 Creel .................. 323/275 X
4,743,779 5/1988 Valley .................. 307/356

FOREIGN PATENT DOCUMENTS 0108256 8/1979 Japan .................. 323/275
0257766 12/1985 Japan .................. 323/285

OTHER PUBLICATIONS

Driscoll, "Limit Cycle Voltage Regulator", IBM Technical Disclosure, 9/77, pp. 1542-1543.

Primary Examiner—Patrick R. Salce
Assistant Examiner—Kristine Peckman
Attorney, Agent, or Firm—Banner, Birch, McKie & Beckett

[57] ABSTRACT

An input-output interface disposed between an electrical device and a switching device which has opened and closed states and is controlled by a voltage of a voltage regulator and comprising a resistor disposed between the output of the switching device and the input of the electrical device, a first voltage holding circuit for holding the voltage at the input of the electrical device to a first voltage which corresponds to a high input voltage of the electrical device, a second voltage holding circuit for holding the voltage at the input of the electrical device to second a voltage which corresponds to a low input voltage of the electrical device, a first current control circuit controlling a current flowing into a line between the resistor and the input of the electrical device, causing a first current to flow when the voltage at the input of the electrical device is less than a third voltage which is between the high input voltage and the low input voltage of the electrical device, and causing a second current to flow when the voltage at the input of the electrical device is greater than the third voltage, and a second current control circuit controlling the current flowing away from a line between the resistor and the input of the electrical device, causing a third current to flow when the voltage at the input of the electrical device is less than a fourth voltage which is between the high input voltage and the low input voltage of the electric device, and causing a fourth current to flow when the voltage of the input of the electrical device is greater than the fourth voltage.

6 Claims, 3 Drawing Sheets

4,862,056

INTERFACE FOR AN ELECTRICAL DEVICE

BACKGROUND OF THE INVENTION

1. Field of the Invention

This invention relates to an input-output interface for an electrical device, and more particularly to an input-output interface disposed between a sensor which generates a binary code signal and an electrical circuit for changing the binary code signal of the sensor into an acceptable signal for the electrical circuit.

2. Statement of the Prior Art

Various input-output interfaces such as buffers, inverters, comparators, hysteresis buffers, etc. are known in the art. The hysteresis buffer is, for example, shown in FIG. 3. The output of a sensor SEN1 is connected to one end of a resistor Rx while the other end of resistor Rx is connected to an input of a hysteresis buffer BU2. The output of the hysteresis buffer BU2 is connected to an input port of a central processing unit CPU comprising a microcomputer. The resistor Rx serves to protect the hysteresis buffer BU2 from overcurrent. The central processing unit CPU relates voltages over VIHCPU volts to a high level, and voltages under VILCPU volts to a low level. The hysteresis buffer BU2 generates an output signal according to the input signal, as shown in FIG. 4. While the output voltage VSEN of sensor SEN1 is increasing, if the output voltage VSEN is greater than the voltage corresponding to VIH, then the ouput voltage VCPU of hysteresis buffer BU2 is increased to a voltage corresponding to VOH. While the output voltage VSEN is decreasing, if the output voltage is less than the voltage corresponding to VIL, then the output voltage VCPU is decreased to a voltage corresponding to VOL. The voltage VIH is larger than the voltage VIHCPU, and the voltage VIL is smaller than the voltage VILCPU. So, while the output voltage VSEN of the sensor SEN1 is increasing from 0 volts, the voltage VSEN is still greater than VIH volts, and the input voltage VCPU of the central processing unit CPU is lower than VILCPU voltage, then, the central processing unit CPU regards the input signal as a low level. While the output voltage VSEN is decreasing, the voltage VSEN is still greater than the VIL voltage, and the input voltage VCPU is greater than VIHCPU voltage, then the central processing unit CPU regards the input signal as a high level.

In these input-output interfaces, at least nine components are necessary. These components include a resistor to protect from over current; a terminal at the sensor side of the resistor; a terminal at the buffer side of the resistor; a buffer; a terminal at the output side of the buffer; a signal line to connect the output of the sensor to a terminal at the sensor side of the resistor; a signal line to connect a terminal at the buffer side of the resistor to an input terminal of the buffer; and a signal line to connect the output terminal of the buffer with the input port of the electric circuit. Since each terminal serves to connect one component to another, it must be strong to assure a reliable conection. Accordingly, it is necessary to be able to provide for a large capacity. For example, in an integrated circuit of the dual-in-line package type, the volume of the package generally depends on the number of the terminals.

BRIEF SUMMARY OF THE INVENTION

It is an object of the present invention to decrease the number of components a circuit uses as an input-output interface when the interface is formed as an integrated circuit.

It is another object of the present invention to provide hysteresis to protect from external noise.

It is a further object of the present invention to maintain proper function with out noise.

With these and other objects in view, the invention is characterized by the methods and construction hereinafter fully described, illustrated in the accompanying drawings, and set forth in the claims hereto appended, it being understood that various changes in the operation, form, proportion and minor details of construction, within the scope of the claims, may be resorted to without departing from the spirit of the invention or sacrificing any of the advantages thereof.

DETAILED DESCRIPTION OF THE PREFERRED EMBODIMENT

Figure 1:
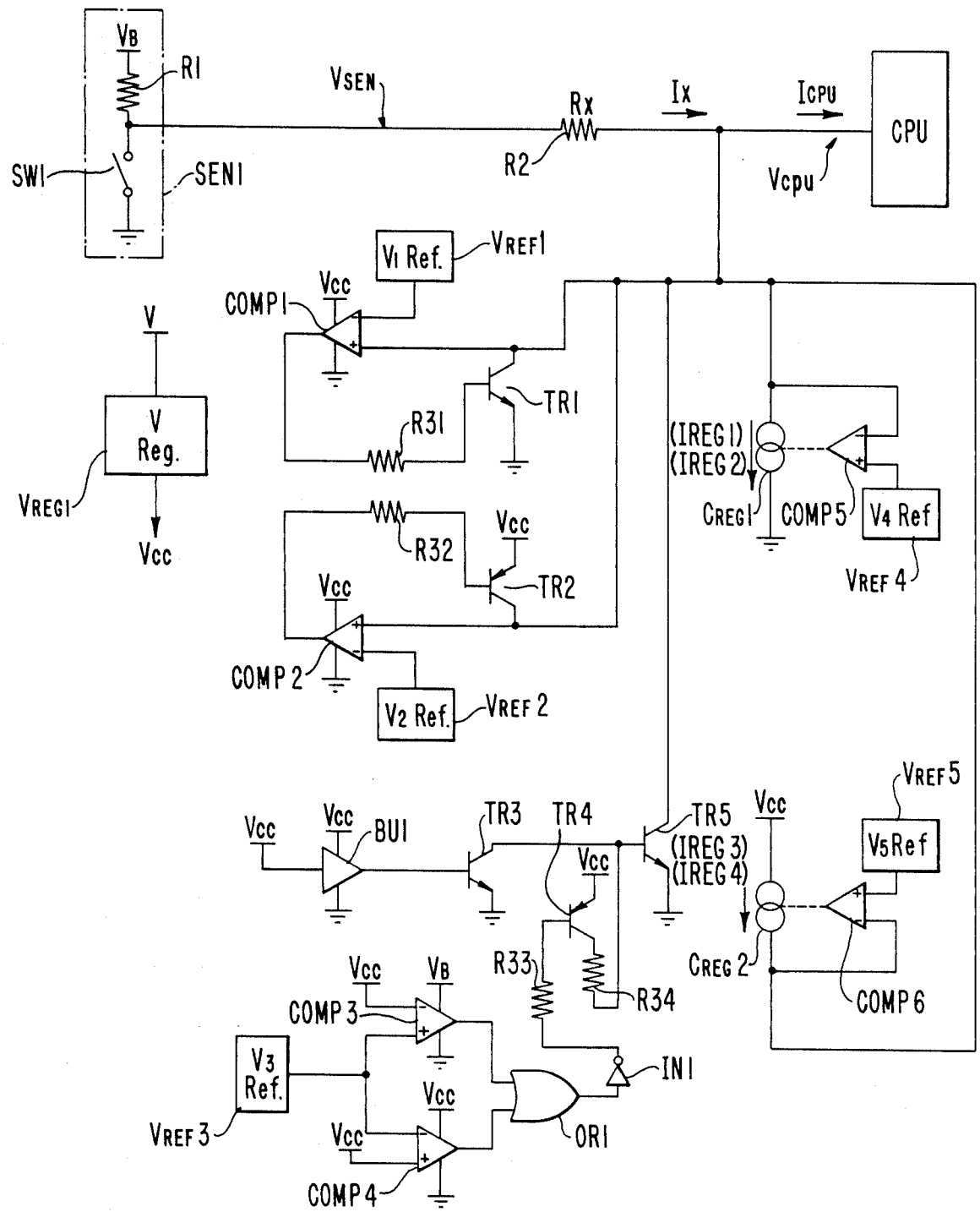
FIG. 1 shows a circuit diagram of an input-output interface according to the teachings of the present invention.

An input-output interface according to the present invention is shown in FIG. 1. A sensor SEN1 is illustrated, for purposes of simple explanation, in the form of a switching device, and is comprised of a resistor R1 and a switch SW1. It is to be understood that various other types of sensors and sensor configurations can be used with the present invention. The sensor may be capable of sensing any of a variety of conditions, factors or virtually anything else capable of being sensed as will be appreciated by one of ordinary skill in the art. One example of what the sensor may sense is a condition in or near an automobile engine, e.g. a temperature, a torque, a flow rate, etc. One end of the switch SW1 is connected to ground and the other end of switch SW1 is connected to one end of resistor R1. The other end of resistor R1 is connected to a voltage source. The voltage source generates voltage VB (VB may be, e.g., a 12-14 volt battery used in an automobile). An output of sensor SEN1 is derived from the node between SW1 and R1. Switch SW1 preferably has two states, i.e., an open-state and a closed-state. When the switch SW1 is in an open state, the output voltage of sensor SEN1 is connected to the voltage source through R1. When switch SW1 is closed, the output voltage may be 0 volts.

A central processing unit CPU which is in the form of a microcomputer which may preferably be constructed as a CMOS IC (complementary metal-oxide semiconductor integrated circuit) type. An input current of the central processing unit CPU is Icpu (Icpu is preferably on the order of a few micro amperes).

An input-output interface is disposed between sensor SEN1 and the central processing unit CPU, and converts the output voltage of the sensor SEN1 into the input voltage of central processing unit CPU. The input-output interface consists of a resistor R2, a voltage regulator Vreg1, a first voltage holding circuit, a second voltage holding circuit, a first current control circuit, and a second current control circuit.

The resistor R2 is disposed between the output of sensor SEN1 and the input of central processing unit CPU. The resistance of the resistor R2 may be chosen in a manner that will be apparent to one of ordinary skill in the art and is shown as having a value of RX ohm.

The voltage regulator Vreg1 is connected to the voltage source, and generates Vcc volts from the output thereof (Vcc may preferably be on the order of 5 volts for purposes of the example that will be presented in the specification).

The first voltage holding circuit may preferably be comprised of a standard-voltage regulator Vref1, a comparator COMP1, a resistor R31 and a NPN transistor TR1. The standard-voltage regulator Vref1, preferably generates a standard voltage on the order of approximately 4.5 volts, and sends the standard voltage to a negative input terminal of comparator COMP1. A positive input terminal of comparator COMP1 is connected to the input of central processing unit CPU. An output of comparator COMP1 is connected to a base of transistor TR1 through resistor R31. An emitter of transistor TR1 is connected to ground, and a collector of transistor TR1 is connected to the input of central processing unit CPU. When the input voltage VCPU of the central processing unit CPU is less than 4.5 volts, the output of comparator COMP1 is a low voltage and transistor TR1 is turned off. If the input voltage VCPU is greater than 4.5 volts, then the output of comparator COMP1 is a high voltage and transistor TR1 is turned on. The input voltage of the central processing unit CPU starts to fall toward 0 volts, but, if the VCPU becomes less than 4.5 volts, transistor TR1 is turned off, so the input voltage VCPU is held to less than 4.5 volts.

It will be appreciated by one of ordinary skill in the art that this circuit protects central processing unit CPU from abnormal high voltages from the output of sensor SEN1, when for example, EMI noise or a surge voltage is on the line between sensor SEN1 and resistor R2, or on the line from the voltage source to sensor SEN1. Here, when transistor R1 is chosen such that its permitted collector current is e.g. 100 milliampere and when resistor R2 is chosen such that its resistance is e.g. 10 Kohm, the input voltage VCPU may be held to 4.5 volts if the output of sensor SEN1 is on the order of up to 1000 volts.

The second voltage holding circuit is preferably comprised of a standard-voltage regulator Vref2, a comparator COMP2, a resistor R32 and a PNP transistor TR2. The standard-voltage regulator Vref2 is connected to the output of voltage regulator Vreg1, and preferably generates a standard voltage which is approximately 0.5 volts, and sends the standard voltage to a negative input terminal of comparator COMP2. A positive input terminal of comparator COMP2 is connected to the input of central processing unit CPU. An output of comparator COMP2 is connected to the base of transistor TR2 through resistor R32. An emitter of transistor TR2 is connected to the output of voltage regulator Vreg1, and a collector of transistor TR2 is connected to the input of central processing unit CPU. When the input voltage VCPU of central processing unit CPU is greater than 0.5 volts, the output of comparator COMP2 is a high voltage and transistor TR2 is turned off. If the voltage VCPU is less than 0.5 volts, then the output of comparator COMP2 is a low voltage and transistor TR2 is turned on. The turning on of TR2 causes the input voltage of central processing unit CPU to rise toward Vcc volts, but, if the VCPU becomes greater than 0.5 volts, transistor TR2 is turned off, so the input voltage VCPU is held at a level of just greater than 0.5 volts.

It will be appreciated by those of skill in the art that this circuit protects central processing unit CPU from abnormal low voltage from the output of the sensor SEN1 when, for example, EMI noise or a surge voltage is on the line between sensor SEN1 and resistor R2 or on the line from the voltage source to the sensor SEN1. When TR2 is chosen such that its collector current is e.g. 100 milliampere and resistor R2 is chosen such that its resistance is e.g. 10 Kohm, the input voltage VCPU is held to not less than 0.5 volts even if the output of sensor SEN1 is as low as on the order of −1000 volts.

The first current control circuit is preferably comprised of a standard-voltage regulator Vref4, a comparator COMP5, and a first constant-current regulator Creg1 (of a type known in the art). The standard-voltage regulator Vref4 is connected with the voltage regulator Vreg1, generates a standard voltage which is preferably on the order of 2.5 volts, and sends the standard voltage to a positive input terminal of comparator COMP5. A negative input terminal of comparator COMP5 is connected to the input of central processing unit CPU. An output of the comparator COMP5 is connected to the first constant-current regulator Creg1. An input terminal of constant-current regulator Creg1 is connected to the input of central processing unit CPU, and an output terminal thereof is connected to ground. The constant-current regulator Creg1 causes a first constantcurrent flow of Ireg1 amperes, when the output of the comparator COMP5 is a high level. The constant-current regulator Creg1 causes a second constant-current flow of Ireg2 ampere, when the output of the comparator COMP5 is a low level. When the input voltage VCPU of central processing unit CPU is less than 2.5 volts, the output of comparator COMP5 is considered a high level and the constant-current regulator Creg1 causes a first constant-current flow of Ireg1 ampere to flow to ground (as indicated generally by the arrow adjacent to Creg1 in FIG. 1). When the input voltage VCFU is greater than 2.5 volts, the output of comparator COMP5 is considered a low level and the constant-current regulator Creg1 causes a second constantcurrent flow of Ireg2 ampere to flow to ground (as indicated by the arrow adjacent to Creg1 in FIG. 1).

The second current control circuit is preferably comprised of a standard-voltage regulator Vref5, a comparator COMP6, and a second constant-current regulator Creg 2. The standard-voltage regulator Vref5 is connected to the voltage regulator Vreg1 and generates a standard voltage which is preferably on the order of 2.5 volts, and sends the standard voltage to a positive input terminal of comparator COMP6. A negative input terminal of cmparator COMP6 is connected to the input of central processing unit CPU. An output of comparator COMP6 is connected to the second constant-current regulator Creg2. An input terminal of constant-current regulator Creg2 is connected to Vcc, and an output terminal of Creg2 is connected to the input of central processing unit CPU. The constant-current regulator Creg2 causes a third constant-current, Ireg3 ampere, to flow when the output of the comparator COMP6 is a high level. The constant-current regulator Creg2 causes a fourth constant-current, Ireg4 ampere, to flow when the output of the cmparator COMP6 is a low level. When the input voltage VCPU of central processing unit CPU is less than 2.5 volts, the output of comparator COMP6 is a high level and the constant-current regulator Creg2 causes Ireg3 amperes to flow to the line input of central processing unit CPU (indicated generally in FIG. 1 by the arrow adjacent to Creg2). When the input voltage VCPU is greater than 2.5 volts, the output of comparator COMP6 is a low level and the constant-current regulator Creg2 causes Ireg4 amperes to flow to the line input of central processing unit CPU (indicated generally by the arrow adjacent to Creg2).

Figure 2:
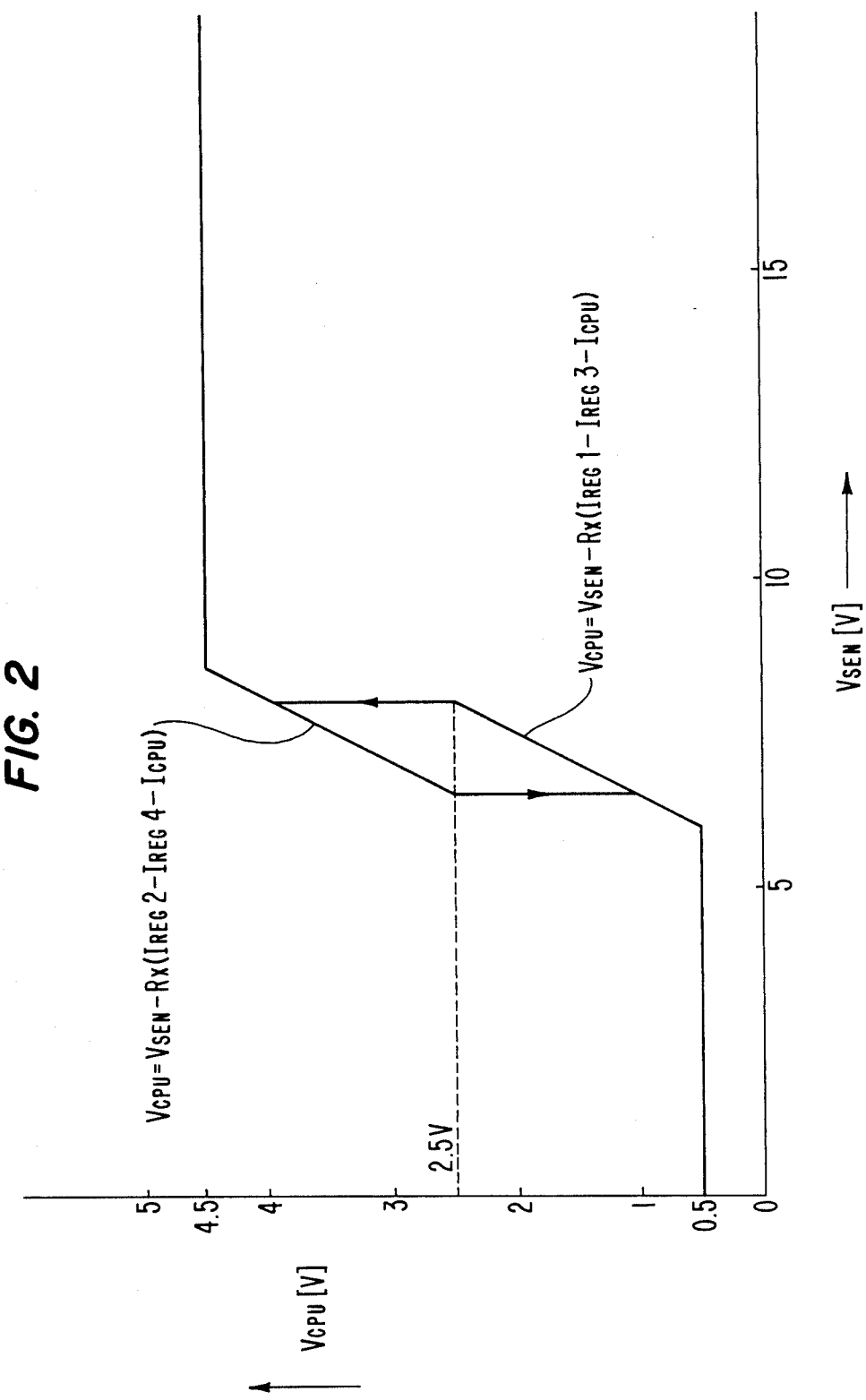
FIG. 2 shows a graph illustrating the relationship between an input voltage and an output voltage of the input-output interface of FIG. 1.
Figure 3:
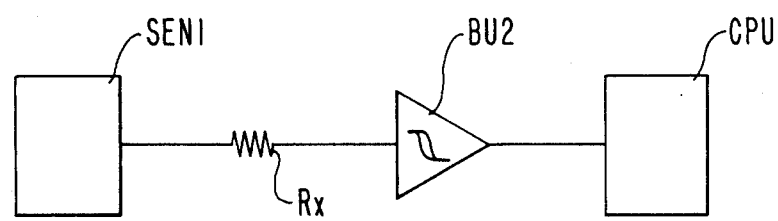
FIG. 3 shows a circuit diagram of an input-output interface using a hysteresis buffer.
Figure 4:
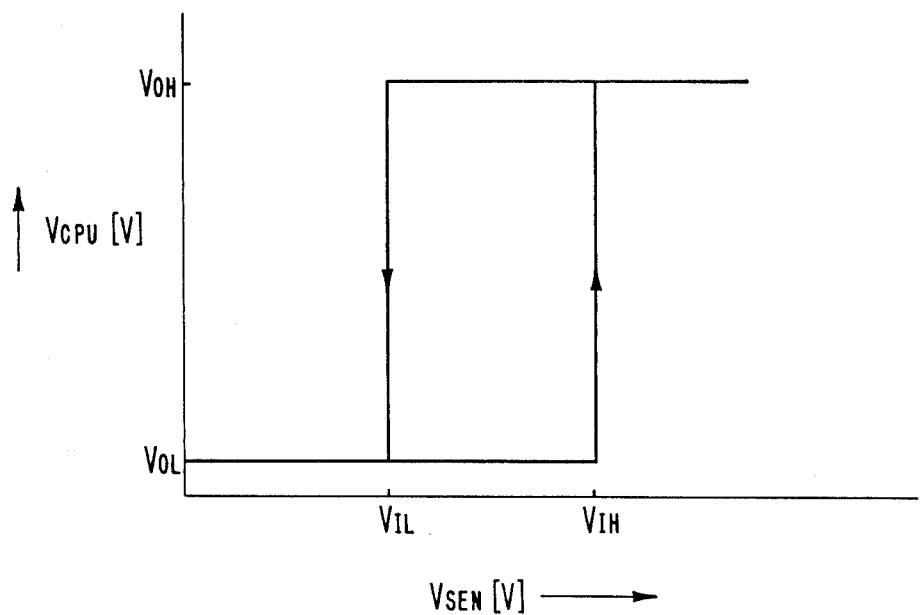
FIG. 4 shows a graph illustrating the relationship between an input voltage and an output voltage of the input-output interface of FIG. 3.

The interaction of the first and second voltage holding circuits and the first and second current control circuits causes a relationship between the output voltage VSEN of the sensor SEN1 and the input voltage VCPU of the central processing unit CPU which is illustrated by the hysteresis curve shown in FIG. 2. As can be seen, there is no state in which the input voltage VCPU of the central processing unit CPU is less than 0.5 volts nor more than 4.5 volts due to the function of the first and second voltage holding circuits. As further seen in FIG. 2, the input voltage VCPU increases according to an increase in the output voltage VSEN of the sensor SEN1 in the region which is not limited by the first and second voltage holding circuits (that is, the area where VCPU is some value between 0.5 volts and 4.5 volts). In this region, when the input voltage VCPU is less than 2.5 volts, the value of current Ix (shown in FIG. 1 as flowing through resistor R2) can be found by the following equation:

$$Ix = Ireg1 - Ireg3 - Icpu$$

Accordingly, the input voltage VCPU corresponds with equation (1) as follows:

$$VCPU = VSEN - Rx(Ireg1 - Ireg3 - Icpu) \quad \text{Equation (1)}$$

If the input voltage VCPU is greater than 2.5 volts, the value current flowing through first and second constant-current regulators is changed so that the value of current IX is changed to:

$$Ix = Ireg2 - Ireg4 - Icpu$$

and input voltage VCPU changes accordingly. VCPU can then be expressed as follows:

$$VCPU = VSEN - Rx(Ireg2 - Ireg4 - Icpu) \quad \text{Equation (2)}$$

Therefore, in the region where VCPU is greater than 0.5 volts and less than 4.5 volts, if VCPU is decreasing, until the input voltage VCPU becomes less than 2.5 volts, the input voltage VCPU is changed according to equation (2), supra. When the input voltage VCPU is increasing but is less than 2.5 volts, the input voltage VCPU is changed according to equation (1), supra.

When the input-output interface is not supplied with the power from the power supply, for example, at a time when the power supply is just started, the power supply is just ended, the power supply is damaged or virtually any other condition which causes the power supply to not supply power to the interface, the output voltage of the sensor SEN1 directly effects the input of the central processing unit CPU. For this reason, this invention has a protective circuit (shown in FIG. 1) to protect the central processing unit CPU. The protective circuit is preferably comprised of a buffer BU1, transistors TR3, TR4, TR5, resistors R33, R34, a standard-voltage regulator Vref3, comparators COMP3, COMP4, an inverter IN1 and an OR circuit OR1. The standard-voltage regulator Vref3 is connected to the voltage source, preferably generates a standard voltage which is preferably approximately 1.4 volts, and sends the standard voltage to both a positive input terminal of comparator COMP3 and a negative input terminal of the comparator COMP4. The negative input terminal of comparator COMP3 and the positive input terminal of comparator COMP4 are connected to the output of voltage regulator Vreg1. The output of comparators COMP3 and COMP4 are connected to two input terminals of the OR circuit OR1. The output of OR circuit OR1 is connected to the base of transistor TR4 through inverter IN1 and resistor R33, as shown in FIG. 1. The emitter of transistor TR4 is connected to the output of the voltage regulator Vreg1, and the collector of transistor TR4 is connected to the base of transistor TR5 through resistor R34. An input terminal of buffer BU1 is connected to the output of voltage regulator Vreg1, and the output of buffer BU1 is connected to the base of transistor TR3. The emitter of transistor TR3 is connected to ground, and the collector of transistor TR3 is connected to the base of transistor TR5. The emitter of transistor TR5 is connected to ground, and the collector of transistor TR5 is connected to the input of central processing unit CPU. Comparator COMP3 is driven by the voltage source VB, but the other comparators are driven by the output voltage of the voltage regulator Vreg1, Vcc.

The operation of the protective circuit will now be explained. When the voltage Vcc at the output of voltage regulator Vreg1 is greater than 1.4 volts or the voltage Vcc is less than 1.4 volts, one of the comparators COMP3 or COMP4 sends a high level voltage to OR circuit OR1, and OR circuit OR1 turns on transistor TR4 through inverter IN1. When the voltage source is turned off, if the voltage VB is less than the Vcc voltage, then comparator COMP4 sends a high level voltage, and if the Vcc voltage is less than the voltage Vb then comparator COMP3 sends a high level voltage. Accordingly, transistor TR4 is usually turned on. When the voltage Vcc of the output of voltage regulator Vreg1 is greater than the threshold voltage of buffer BU1, the buffer BU1 turns on transistor TR3, and transistor TR5 is turned off. When the Vcc voltage is less than the threshold voltage of the buffer BU1, the buffer BU1 turns off transistor TR3. Here, when transistor TR4 is turned off, the transistor TR5 is turned off, and when the transistor TR4 is turned on, the transistor TR5 is turned on through the resistor R34. When transistor TR5 is turned on, input voltage VCPU of central processing unit CPU is held to 0 volts, and protected from the change of the voltage of the sensor SEN1. This prevents abnormal operation of the CPU when the CPU is starting up or stopping and the voltage of the voltage source is down.

In this embodiment, the central processing unit is in the form of microcomputer, but other electric devices such as but not limited to, TTL IC, CMOS IC, transistor circuits, actuators, etc. may be used instead of the microcomputer.

The first and second voltage holding circuits, the first and second current control circuits and the protective circuit may be integrated into one IC. When an IC integrated circuit is used as an inputoutput interface, it is necessary to have only seven components including a resistor; a terminal at the sensor side of the resistor; a terminal at the IC side of the resistor; an IC; a terminal for the IC; a signal line to connect the output of sensor SEN1 with a terminal at the sensor side of resistor R2; a signal line to connect a terminal at the IC side of the resistor with a terminal of the IC; and a signal line to connect a terminal of the IC, a terminal of the IC side of the resistor and the input terminal of an electric device. By so doing, the interface may be made small.

In this embodiment, the voltage of the regulators are preferably fixed, but the voltage of the regulators may be variable by hand or otherwise. It is further to be understood that the chosen voltage values throughout the specification are used by way of example only and it will be apparent to those skilled in the art that other voltages could be selected to be the chosen values. It will further be apparent that changing the values of the voltages may change the size and shape of the hysteresis curve of FIG. 2. Moreover, the holding voltages may also be changed.

While a particular embodiment of the invention has been shown and described, it will be obvious to those skilled in the art that the various changes and modifications may be made without departing from the invention in its broader aspects and the appended claims are intended to cover all such changes and modifications that fall within the true spirit and scope of the invention.

We claim:

1. An input-output interface disposed between an output electrical device which produces a first voltage at an output thereof and an input electrical device which has a second voltage as an input thereto, comprising:

resistor means for providing a resistance between the output of said first electrical device and the input of said second electrical device;

first circuit means for preventing the voltage at the input of said second electrical device from exceeding a predetermined maximum input voltage;

second circuit means for preventing the voltage at the input of said second electrical device from falling below a predetermined minimum input voltage;

first current control means for causing a first current to flow when the voltage at the input of said second electrical device is less than a first predetermined voltage and causing a second current to flow when the voltage at the input of said second electrical device is greater than said first predetermined voltage; and second current control means for causing a third current to flow when the voltage at the input of said second electrical device is greater than a second predetermined voltage and causing a fourth current to flow when the voltage at the input of said second electrical device is less than said second predetermined voltage.

2. An input-output interface disposed between a switching device, and an electrical device, said switching device having open and closed states, said interface comprising:

a resistor disposed between the output of said switching device and the input of said electrical device;

first voltage holding circuit means for holding the voltage at said input of said electrical device to be not greater than a first voltage which corresponds to a high input voltage of said electrical device;

second voltage holding circuit means for holding the voltage at said input of said electrical device to be not less than a second voltage which corresponds to a low input voltage of said electrical device;

first current control circuit means for controlling a current flowing into a line between the resistor and the input of said electrical device, said first current control circuit means causing a first current to flow when the voltage at said input of said electrical device is less than a third voltage, said third voltage being less than said first voltage and greater than said second voltage and causing a second current to flow when the voltage at said input of said electrical device is greater than said third voltage; and second current control circuit means for controlling a current flowing from a line between said resistor and said input of said electrical device, said second current control circuit means causing a third current to flow when the voltage at said input of said electrical device is less than a fourth voltage, said fourth voltage being less than said first voltage and greater than said second voltage, and causing a fourth current to flow when said voltage at said input of said electrical device is greater than said fourth voltage.

3. An input-output interface as claimed in claim 2 wherein said switching device comprises a sensor which is comprised of a resistor and a switch which has open and closed states;

and further wherein said switch has at least two terminals, where a first terminal of said switch is connected to one end of said resistor, a second terminal of said switch and the other end of said resistor are connected to a negative and a positive terminal of a voltage source, respectively, and an output of said sensor is taken from the connection point between the first terminal of said switch and said one end of said resistor.

4. An input-output interface as claimed in claim 2 wherein said first voltage holding circuit means is comprised of first standardvoltage regulator means for generating said first voltage, first comparator means connected to the input of said electrical device and said first standard-voltage regulator means for lowering the voltage of said input of said electrical device to a low level voltage which is less than said first voltage if the voltage at said input of said electrical device is greater than said first voltage;

and further wherein said second voltage holding circuit is comprised of a second standard-voltage regulator means for generating said second voltage, second comparator means connected to the input of said electrical device and said second standard-voltage regulator means for raising the voltage at said input of said electrical device to a high level voltage which is greater than said second voltage if the voltage at said input of said electrical device is less than said second voltage.

5. An input-output interface as claimed in claim 2 wherein said first current control circuit means is comprised of voltage regulator means for generating said third voltage, and first constant-current regulator means connected to the input of said electrical device and a positive terminal of a voltage source for controlling a current flow, wherein said first constant-current regulator means causes said first current to flow when the voltage at said input of said electrical device is less than said third voltage and causes said second current to flow when the voltage at said input of said electrical device is greater than said third voltage; and
wherein said second current control circuit means is comprised of voltage regulator means for generating said fourth voltage, and
second constant-current regulator means connected to said input of said electrical device and a negative terminal of said voltage source for controlling a current flow,
wherein said second constant-current regulator means causes said third current to flow when the voltage at said input of said electrical device is less than said fourth voltage and causes said fourth current to flow when the voltage at said input of said electrical device is greater than said fourth voltage.

6. An input-output interface disposed between a switching device, which is controlled by a voltage of a voltage regulator, and an electrical device, said switching device having open and closed states, said interface comprising:
a resistor disposed between the output of said switching device and the input of said electrical device;
a first voltage holding circuit comprising first standard-voltage regulator means for generating a first voltage which corresponds to a high input voltage of said electrical device, and comparator means connected to the input of said electrical device and the first standard-voltage regulator means for lowering the voltage at said input of said electrical device to a low level voltage which is less than said first voltage when the voltage at said input of said electrical device is greater than said first voltage;
a second voltage holding circuit comprising second standard-voltage regulator means for generating a second voltage which corresponds to a low input voltage of said electrical device, and comparator means connected to the input of said electrical device and the second standard-voltage regulator means for raising the voltage at said input of said electrical device to a high level voltage which is greater than said second voltage when the voltage at said input of said electrical device is less than said second voltage;
a first current control circuit comprising third standard voltage regulator means generating a third voltage which is between the high input voltage and low input voltage of said electrical device, and first constant-current regulator means connected to the input of said electrical device and a positive terminal of said third voltage regulator means, wherein said first constant-current regulator means causes a first current to flow when the voltage at said input of said electrical device is less than said third voltage and causes a second current to flow when the voltage at said input of said electrical device is greater than said third voltage; and
a second current control circuit comprising fourth standard voltage regulator means for generating a fourth voltage which is between the high input voltage and the low input voltage of said electrical device, and a second constant-current regulator means connected to said input of said electrical device and a negative terminal of said voltage regulator, wherein said second constant-current regulator causes a third current to flow when the voltage at said input of said electrical device is less than said fourth voltage and causes a fourth current to flow when the voltage at said input of said electrical device is greater than said fourth voltage.

* * * * *